(12) United States Patent
Yan et al.

(10) Patent No.: US 12,029,145 B2
(45) Date of Patent: Jul. 2, 2024

(54) MEMORY DEVICE

(71) Applicant: Kioxia Corporation, Tokyo (JP)

(72) Inventors: Bairu Yan, Kanagawa (JP); Yoshiki Kamata, Tokyo (JP); Kazuhiko Yamamoto, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 532 days.

(21) Appl. No.: 17/201,356

(22) Filed: Mar. 15, 2021

(65) Prior Publication Data

US 2021/0376236 A1 Dec. 2, 2021

(30) Foreign Application Priority Data

May 29, 2020 (JP) .................... 2020-094945

(51) Int. Cl.
| | | |
|---|---|---|
| H01L 45/00 | (2006.01) | |
| H01L 27/24 | (2006.01) | |
| H10B 63/00 | (2023.01) | |
| H10N 70/00 | (2023.01) | |
| H10N 70/20 | (2023.01) | |

(52) U.S. Cl.
CPC ......... *H10N 70/8828* (2023.02); *H10B 63/80* (2023.02); *H10N 70/043* (2023.02); *H10N 70/231* (2023.02); *H10N 70/826* (2023.02)

(58) Field of Classification Search
CPC .................................................. H10N 70/8828
See application file for complete search history.

(56) References Cited

U.S. PATENT DOCUMENTS

| | | |
|---|---|---|
| 8,617,972 B2 | 12/2013 | Zheng |
| 8,878,153 B2 | 11/2014 | Tsuji |
| 8,993,374 B2 | 3/2015 | Erbetta et al. |
| 10,026,895 B2 | 7/2018 | Kamata |
| 10,153,429 B2 | 12/2018 | Kamata |
| 10,177,309 B1 | 1/2019 | Kamata |
| 10,559,750 B2 | 2/2020 | Asao |

(Continued)

FOREIGN PATENT DOCUMENTS

| | | |
|---|---|---|
| JP | 4621897 B2 | 1/2011 |
| JP | 5621784 B2 | 11/2014 |

(Continued)

OTHER PUBLICATIONS

Kolobov, et al., "Atomic Reconfiguration of van der Waals Gaps as the Key to Switching in $GeTe/Sb_2Te_3$ Superlattices", ACS Omega (vol. 2, No. 9), 2017, pp. 6223-6232, DOI: 10.1021/acsomega.7b00812.1

(Continued)

*Primary Examiner* — Mounir S Amer
(74) *Attorney, Agent, or Firm* — Foley & Lardner LLP

(57) ABSTRACT

According to one embodiment, a memory device includes a first electrode, a second electrode, and a resistive layer provided between the first electrode and the second electrode, containing at least one of antimony (Sb) and bismuth (Bi) as a first element, and tellurium (Te) as a second element, and having a variable resistance value. The resistive layer includes a first layer having a hexagonal crystal structure containing the first element and the second element. The first layer contains a group 14 element as a third element.

7 Claims, 14 Drawing Sheets

(56) References Cited

U.S. PATENT DOCUMENTS

| | | | |
|---|---|---|---|
| 11,037,984 B1* | 6/2021 | Song | H10N 70/011 |
| 2010/0200828 A1 | 8/2010 | Tominaga | |
| 2016/0013406 A1* | 1/2016 | Lee | H10N 70/245 |
| | | | 257/4 |
| 2016/0099290 A1* | 4/2016 | Asao | H10N 70/245 |
| | | | 257/4 |
| 2019/0088868 A1 | 3/2019 | Kamata | |
| 2020/0091233 A1 | 3/2020 | Takashima | |
| 2021/0104668 A1* | 4/2021 | Kim | H10B 63/20 |
| 2021/0313397 A1* | 10/2021 | Lee | H10N 70/231 |
| 2022/0310918 A1* | 9/2022 | Sasaki | H10N 70/882 |

FOREIGN PATENT DOCUMENTS

| | | |
|---|---|---|
| JP | 2017-143154 A | 8/2017 |
| JP | 2018-6557 A | 1/2018 |
| JP | 2020-47316 A | 3/2020 |
| WO | WO-2020/012916 A1 | 1/2020 |

OTHER PUBLICATIONS

Rao, et al., "Reducing the stochasticity of crystal nucleation to enable subnanosecond memory writing", Science (vol. 358, No. 6369), 2017, pp. 1423-1427, DOI: 10.1126/science.aao3212.

Saito, et al., "A two-step process for growth of highly oriented $Sb_2Te_3$ using sputtering", AIP Advances (vol. 6, No. 4), 2016, p. 045220 (6 pages), DOI: 10.1063/1.4948536.

Tominaga, et al., "Role of Ge Switch in Phase Transition: Approach using Atomically Controlled $GeTe/Sb_2Te_3$ Superlattice", Japanese Journal of Applied Physics (vol. 47, No. 7), 2008, pp. 5763-5766, DOI: 10.1143/jjap.47.5763.

Tominaga, et al., "What is the Origin of Activation Energy in Phase-Change Film?", Japanese Journal of Applied Physics (vol. 48, No. 3), 2009, p. 03A053 (3 pages), DOI: 10.1143/jjap.48.03a053.

* cited by examiner

MEMORY DEVICE

CROSS-REFERENCE TO RELATED APPLICATIONS

This application is based upon and claims the benefit of priority from Japanese Patent Application No. 2020-094945, filed May 29, 2020, the entire contents of which are incorporated herein by reference.

FIELD

Embodiments described herein relate generally to a memory device.

BACKGROUND

As a resistance change type memory device, a phase change memory (PCM) and superlattice type interfacial phase change memory (iPCM) are proposed.

However, in the above-mentioned conventional resistance change type memory devices, there has been a problem that these memory devices require much power consumption.

DETAILED DESCRIPTION

In general, according to one embodiment, a memory device includes: a first electrode; a second electrode; and a resistive layer provided between the first electrode and the second electrode, containing at least one of antimony (Sb) and bismuth (Bi) as a first element, and tellurium (Te) as a second element, and having a variable resistance value, wherein the resistive layer includes a first layer having a hexagonal crystal structure containing the first element and the second element and the first layer contains a group 14 element as a third element.

Embodiments will be described hereinafter with reference to the accompanying drawings.

Embodiment 1

Figure 1:
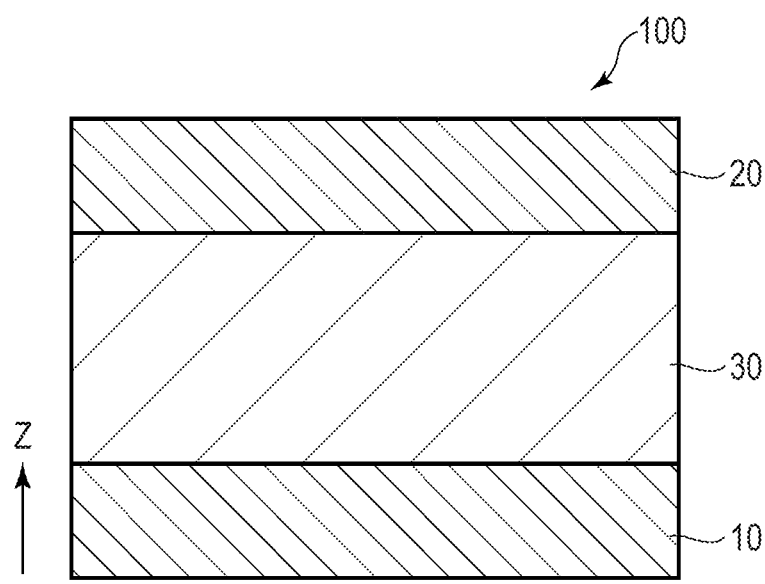
FIG. 1 is a cross-sectional view schematically showing the configuration of a memory device according to a first embodiment.

FIG. 1 is a cross-sectional view schematically showing the configuration of a memory device according to a first embodiment. More specifically, FIG. 1 is a cross-sectional view schematically showing the configuration of a resistance change type nonvolatile memory element. A plurality of memory elements each having the configuration shown in FIG. 1 is integrated on a semiconductor substrate.

A memory element 100 is provided on a lower structure including a semiconductor substrate (not shown) and transistor (not shown), and includes a bottom electrode (one of a first electrode and second electrode) 10, top electrode (the other of the first electrode and second electrode) 20, and resistive layer 30 provided between the bottom electrode 10 and top electrode 20 and having a variable resistance value. These bottom electrode 10, top electrode 20, and resistive layer 30 are stacked on top of each other in layers in a direction perpendicular to the semiconductor substrate.

The bottom electrode 10 and top electrode 20 are formed of a metal such as tungsten (W) or the like. The top surface of the bottom electrode 10 is in contact with the undersurface of the resistive layer 30, and undersurface of the top electrode 20 is in contact with the top surface of the resistive layer 30.

The resistive layer 30 contains therein at least one of antimony (Sb) and bismuth (Bi) as a first element, and tellurium (Te) as a second element. That is, the resistive layer 30 may contain therein only Sb as the first element, may contain only Bi, and may contain both of Sb and Bi. In this embodiment, the resistive layer 30 contains therein only Sb as the first element.

Further, the resistive layer 30 has a hexagonal crystal structure containing the first element and second element. The c-axis of the hexagonal crystal structure of the resistive layer 30 is oriented in the direction (Z-direction) in which the bottom electrode 10, top electrode 20, and resistive layer 30 are stacked. In other words, the c-axis of the hexagonal crystal structure of the resistive layer 30 is oriented in the direction in which a current flows between the bottom electrode 10 and top electrode 20.

The resistive layer 30 further contains therein a group 14 element as a third element in addition to the first element and second element. It is desirable that the concentration of the third element contained in the resistive layer 30 be within the range of $1 \times 10^{18}$ to $1 \times 10^{21}$ cm$^{-3}$. More specifically, the resistive layer 30 contains therein carbon (C), silicon (Si), germanium (Ge), tin (Sn) or lead (Pb) as the group 14 element. In this embodiment, the resistive layer 30 contains therein Ge as the group 14 element.

Figure 2:
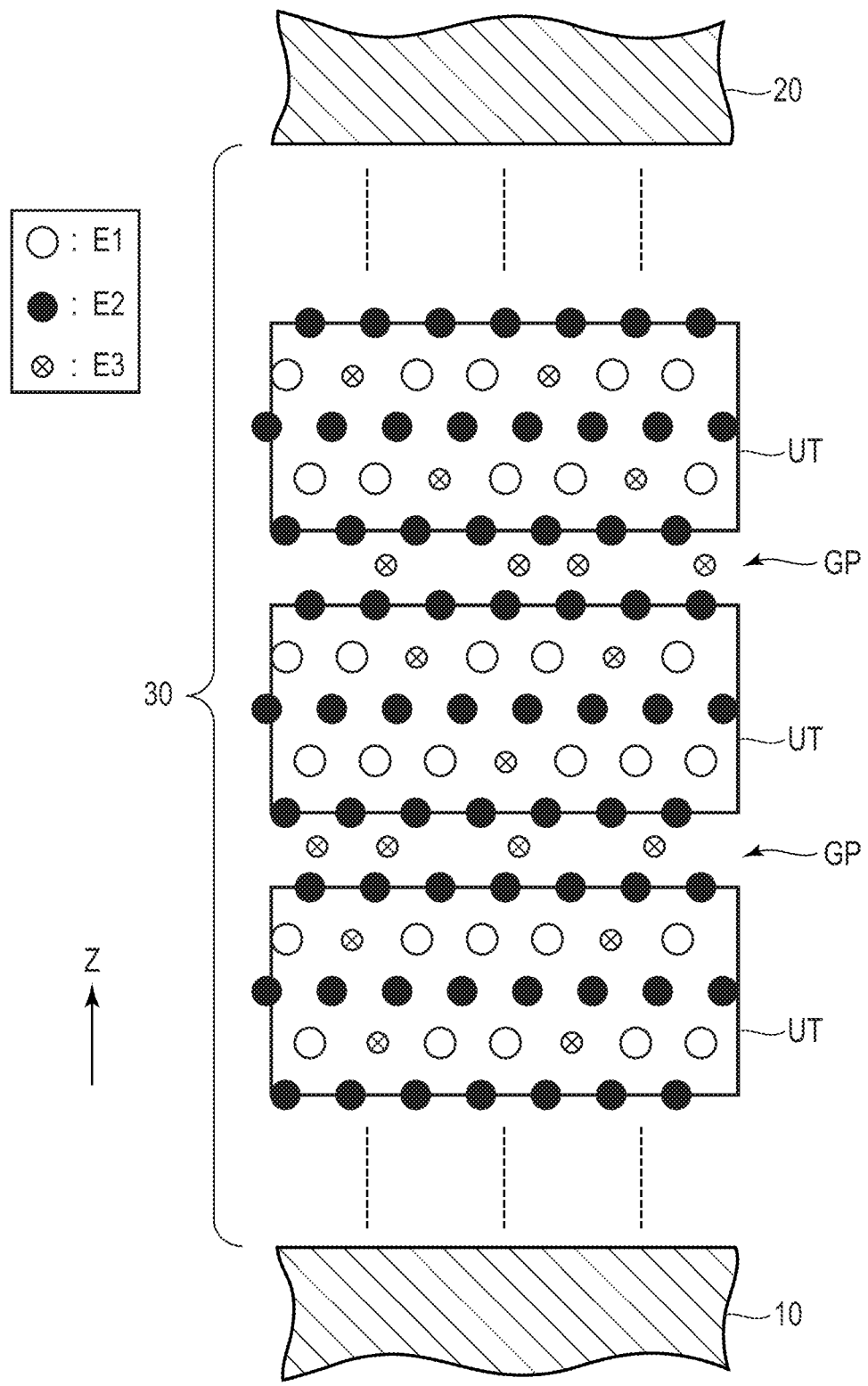
FIG. 2 is a view schematically showing the internal structure of a resistive layer in the memory device according to the first embodiment.

FIG. 2 is a view schematically showing the internal structure of the resistive layer (first layer) 30.

The resistive layer 30 is an alloy layer containing the first element E1 (Sb in this embodiment) and second element E2 (Te in this embodiment). Particularly, it is known that an alloy layer ($Sb_2Te_3$ layer in this embodiment) in which the ratio (E1:E2) between the first element E1 and second element is 2:3 has a stable structure. More specifically, as shown in FIG. 2, a unit structure UT is constituted of five atomic layers arranged in the Z-direction (thickness direction of the resistive layer 30, i.e., direction in which the bottom electrode 10, top electrode 20, and resistive layer 30 are stacked on top of each other) in the order of E2-E1-E2-E1-E2, and resistive layer 30 is formed by stacking a plurality of unit structures UT in the Z-direction. In the $Sb_2Te_3$ layer constituting the unit structure UT, the Sb atom and Te atom in the unit structure UT strongly combine with each other by a covalent bond, and the $Sb_2Te_3$ layer has a hexagonal crystal structure in which the c-axis is oriented in the Z-direction.

Between unit structures UT adjacent to each other in the stacking direction (Z-direction), a gap GP is provided. This gap GP is a van del Waals (vdW) gap.

In the above-mentioned unit structure UT and gap GP, the group 14 element (Ge in this embodiment) is distributed as the third element E3. In the unit structure UT, the third element E3 (Ge) is distributed at positions of vacancies of the first element E1 (Sb) and, in the gap GP, the third element E3 (Ge) not constituting the hexagonal crystal structure is distributed.

The resistance value of the resistive layer 30 changes according to the distribution of the third element E3 in the resistive layer 30. More specifically, the third element E3 moves between the unit structure UT and gap GP, whereby the distribution of the third element E3 in the unit structure UT and third element E3 in the gap GP change and thus the resistance value of the resistive layer 30 changes. The distribution of the third element E3 in the resistive layer 30 changes according to a write signal (voltage signal or current signal) to be applied between the bottom electrode 10 and top electrode 20. More specifically, according to the magnitude (absolute value) of the write signal, falling speed of the write signal or waveform shape of the signal, the distribution of the third element E3 in the resistive layer 30 changes and resistance value of the resistive layer 30 changes. Even when the distribution of the third element E3 in the resistive layer 30 changes, the hexagonal crystal structure of the resistive layer 30 is maintained as it is. After the application of the write signal is completed, the distribution of the third element E3 in the resistive layer 30 is maintained and resistance value of the resistive layer 30 is also maintained.

As described above, in the memory element 100 of this embodiment, by changing the distribution of the third element in the resistive layer 30 according to the write signal to be applied between the bottom electrode 10 and top electrode 20, it is possible to change the resistance value of the resistive layer 30. Therefore, it is possible to memorize binary data or multilevel data in a nonvolatile manner according to the resistive state (resistance value) of the resistive layer 30.

Next, the manufacturing method (manufacturing method of the memory element 100) of the memory device according to this embodiment will be described with reference to the cross-sectional views of FIG. 3A and FIG. 3B.

Figure 3A:
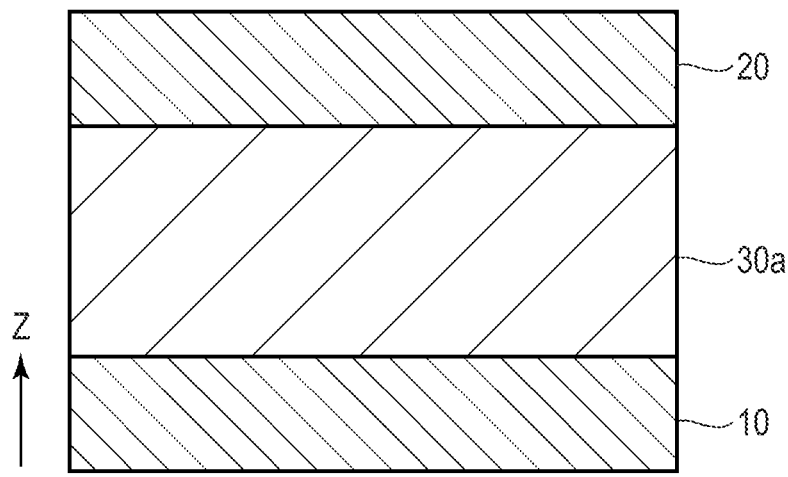
FIG. 3A is a cross-sectional view schematically showing part of the manufacturing method of the memory device according to the first embodiment.

First, as shown in FIG. 3A, the bottom electrode 10, top electrode 20, and a preparatory resistive layer 30a for obtaining the resistive layer 30 is formed.

The method of forming the preparatory resistive layer 30a is as follows. First, an $Sb_2Te_3$ layer having a thickness of about 1 to 10 nm is formed by sputtering at room temperature. Subsequently, after raising the temperature inside the sputtering apparatus to about 150 to 250° C. in a vacuum ($10^{-6}$ to $10^{-4}$ Pa), an additional $Sb_2Te_3$ layer having a thickness of about 1 to 50 nm is formed. Thereby, as the preparatory resistive layer 30a, a c-axis-oriented $Sb_2Te_3$ layer having a hexagonal crystal structure is obtained.

Figure 4:
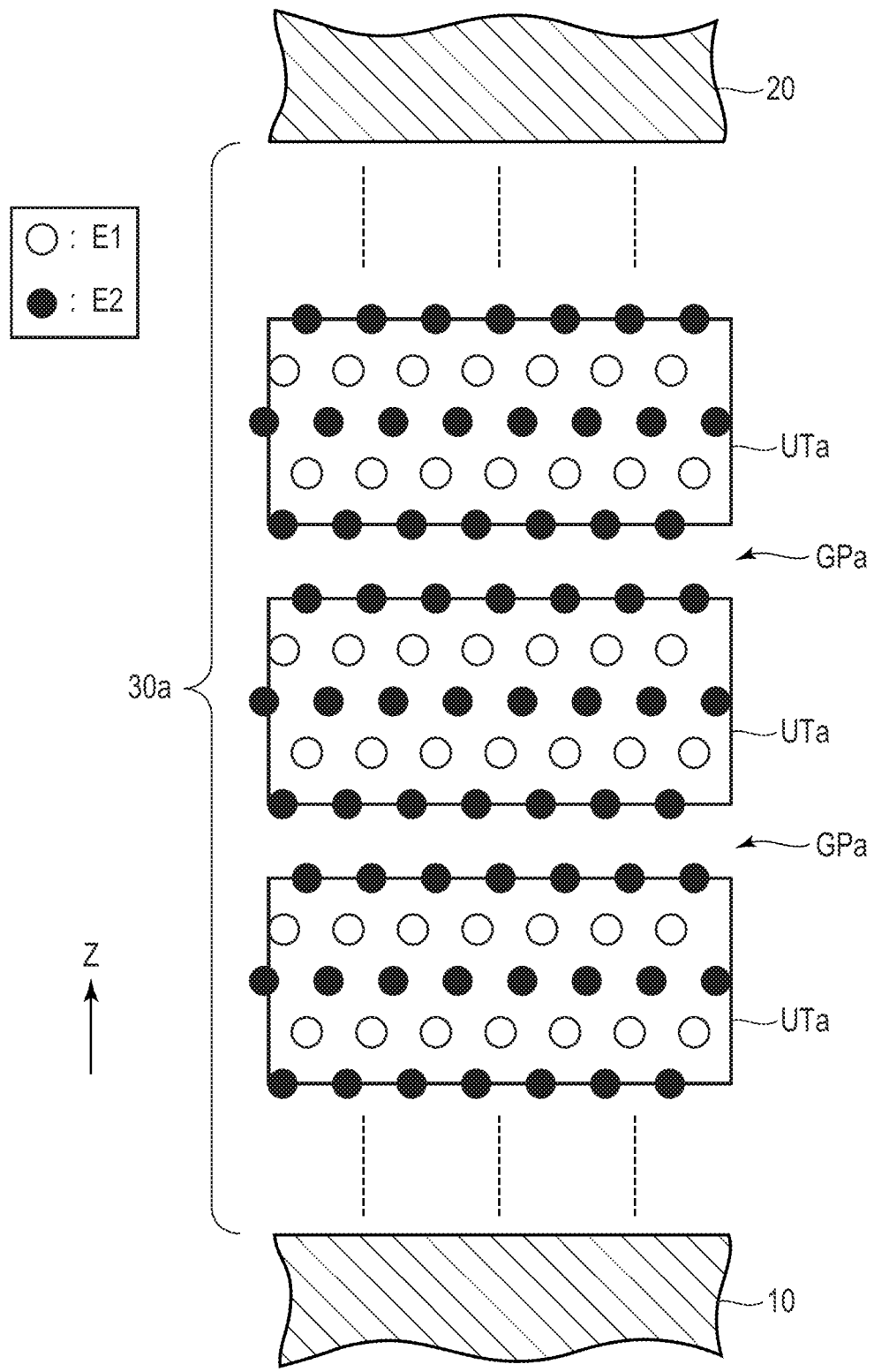
FIG. 4 is a view schematically showing the internal structure of a preparatory resistive layer in the memory device according to the first embodiment.

FIG. 4 is a view schematically showing the internal structure of the preparatory resistive layer 30a. The structure of the preparatory resistive layer 30a has, as in the case of the internal structure of the resistive layer 30 shown in FIG. 2, a structure in which a plurality of unit structures UTa are stacked on top of each other in the Z-direction and, between unit structures UTa adjacent to each other in the stacking direction (Z-direction), a van del Waals (vdW) gap GPa is provided. However, the third element (group 14 element) is not contained in the preparatory resistive layer 30a.

Figure 3B:
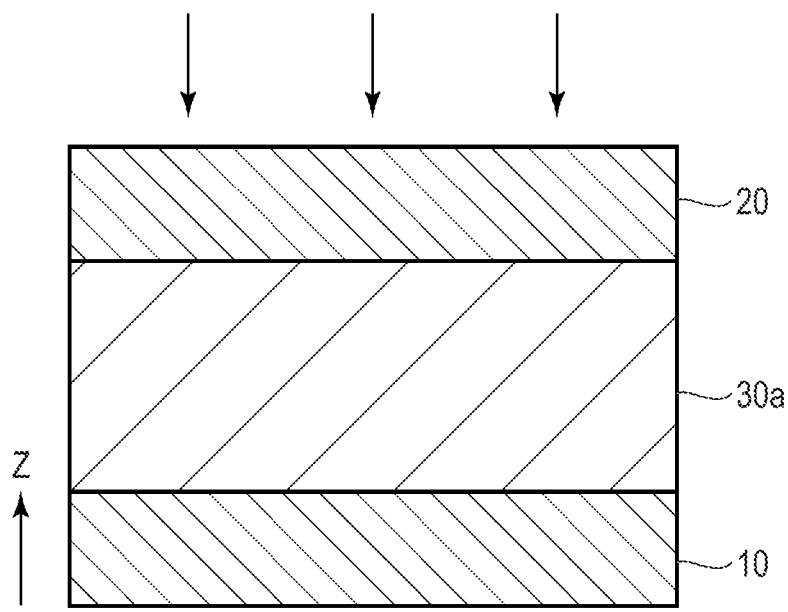
FIG. 3B is a cross-sectional view schematically showing part of the manufacturing method of the memory device according to the first embodiment.

Next, as shown in FIG. 3B, the preparatory resistive layer 30a is doped with Ge ions by ion implantation. It is desirable that in this ion implantation process, ion implantation be carried out at such an accelerating voltage and in such a Ge dose amount that the crystallinity of the $Sb_2Te_3$ layer (preparatory resistive layer 30a) is maintained (the c-axis-oriented hexagonal crystal structure is maintained). More specifically, the $Sb_2Te_3$ layer (preparatory resistive layer 30a) is doped with Ge ions by an accelerating voltage of a range 50 to 150 keV and in a dose amount of a range $1 \times 10^{14}$ to $1 \times 10^{16}$ cm$^{-2}$. By implanting the Ge ions in the $Sb_2Te_3$ layer on such conditions, it has been confirmed that the crystallinity is appropriately maintained. The dose amount of the range $1 \times 10^{14}$ to $1 \times 10^{16}$ cm$^{-2}$ corresponds to an amount enough to fill up the vacancies of about $10^{20}$ cm$^{-3}$ in the $Sb_2Te_3$ layer.

Thereafter, by subjecting the $Sb_2Te_3$ layer to heat treatment at a temperature of about 150 to 400° C. (more desirably 180 to 260° C.), it is possible to recover the crystallinity of the $Sb_2Te_3$ layer. In the manner described above, the resistive layer 30 of FIG. 1 having the internal structure shown in FIG. 2 is obtained.

It should be noted that although in the above-mentioned manufacturing method, the third element is introduced into the preparatory resistive layer 30a by ion implantation, the third element may also be introduced into the preparatory resistive layer 30a by plasma doping, vapor-phase doping, solid-phase diffusion or the like. Even when any one of these methods is used, it is possible to, as in the case of ion implantation, introduce the third element into the preparatory resistive layer 30a in a state where the crystallinity of the preparatory resistive layer 30a is maintained (in a state where the c-axis-oriented hexagonal crystal structure is maintained).

As described above, in this embodiment, the resistive layer 30 has a hexagonal crystal structure containing the first element and second element, and the resistive layer 30 contains therein the group 14 element as the third element. By virtue of such a configuration, in this embodiment, it is possible to change the distribution of the third element in the resistive layer 30 according to the write signal to be applied between the bottom electrode 10 and top electrode 20, and change the resistance value of the resistive layer 30 according to the distribution of the third element. Thereby, in this embodiment, it is possible to obtain a resistance change type memory element of low power consumption and capable of carrying out a high-speed operation.

Further, in this embodiment, the resistive layer 30 is formed by doping the preparatory resistive layer 30a with the third element. That is, the resistive layer 30 is a layer obtained by adding the third element to the base structure containing the first and second elements and having a hexagonal crystal structure, and has a comparatively simple structure. Accordingly, in this embodiment, it is possible to obtain a resistance change type memory element having a simple structure by using a simplified manufacturing process.

Hereinafter, descriptions will be given of the above-mentioned items.

As the resistance change type nonvolatile memory element, a phase change memory (PCM) element and interfacial phase change memory (iPCM) element are known.

As the representative PCM element, a PCM element in which an alloy (GST alloy) of Ge, Sb, and Te is used is known. In the PCM element in which the GST alloy is used, binary data is memorized on the basis of a resistance change of the resistive layer caused by the phase change from/to the crystalline phase (low-resistance state) to/from the amorphous phase (high-resistance state). However, in the PCM element, it is necessary to make a large current flow through the resistive layer in order to cause the phase change, and the power consumption is made larger. Further, in the PCM element, a certain length of time is required to cause the phase change, and it is difficult to realize a high-speed operation.

In this embodiment, by changing the distribution of the third element in the resistive layer 30 in the state where the crystal structure of the resistive layer 30 is maintained, the resistance value of the resistive layer 30 is changed. Accordingly, in this embodiment, it is possible to obtain a resistance change type memory element of low power consumption and capable of carrying out a high-speed operation.

As the representative iPCM element, a superlattice type element in which a GeTe crystalline layer and $Sb_2Te_3$ crystalline layer are alternately stacked on top of each other in layers is known. In this iPCM element, the resistive layer is in the crystalline phase in both the low-resistance state and high-resistance state, and hence a low-power consumption operation and high-speed operation are enabled. However, regarding the iPCM element, it is necessary to alternately stack the GeTe crystalline layer and $Sb_2Te_3$ crystalline layer on top of each other while controlling the number of atomic layers of each GeTe crystalline layer and number of atomic layers of each $Sb_2Te_3$ crystalline layer, and thus the manufacturing process thereof is complicated.

In this embodiment, the resistive layer 30 is formed by doping the preparatory resistive layer 30a having a hexagonal crystal structure with the third element. Accordingly, in this embodiment, it is possible to obtain a resistance change type memory element having a simple structure by using a simplified manufacturing process.

Next, a modified example of this embodiment will be described below.

Figure 5:
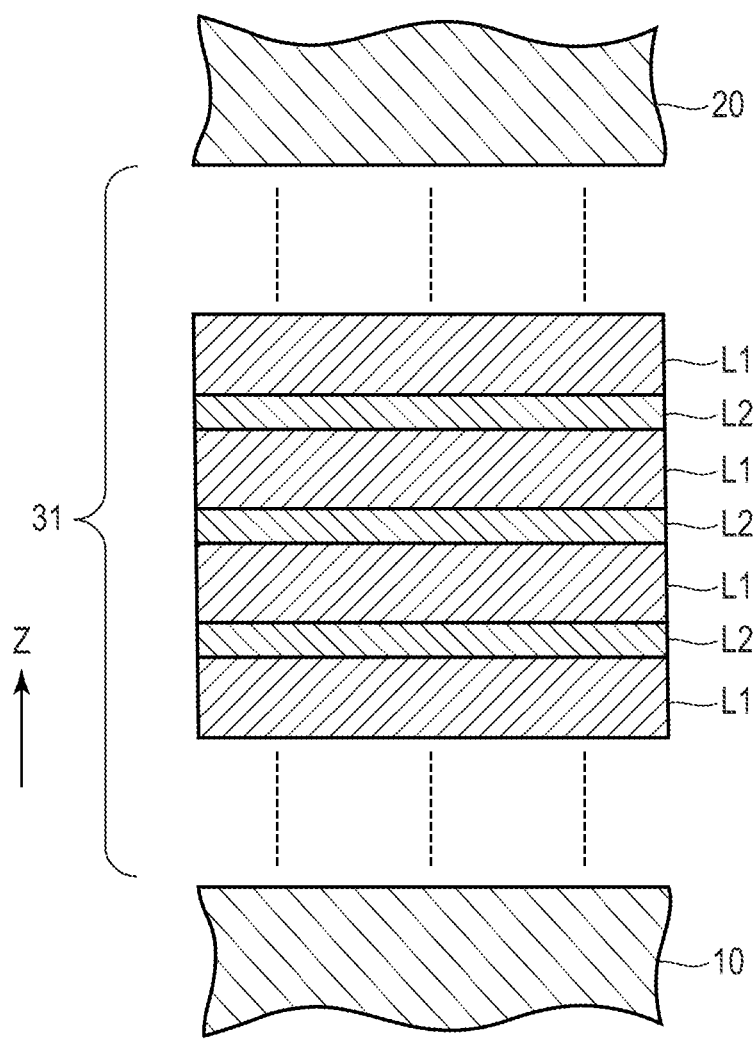
FIG. 5 is a cross-sectional view schematically showing the structure of a resistive layer in a memory device according to a modified example of the first embodiment.

FIG. 5 is a cross-sectional view schematically showing the structure of a resistive layer 30 in the modified example.

The resistive layer 30 of this modified example is an iPCM type resistive layer and includes a superlattice type crystal structure in which a first layer L1 containing a first element (for example, Sb) and second element (for example, Te) and second layer L2 containing the second element (for example, Te) and third element (for example, Ge) are alternately stacked on top of each other in layers. For example, the first layer L1 is constituted of five $Sb_2Te_3$ alloy layers, and second layer L2 is constituted of four $Ge_2Te_2$ alloy layers. The third element (group 14 element, for example, Ge) is distributed in such an iPCM type resistance change layer. That is, in the resistive layer 30, Ge not constituting the crystal structure of the second layer L2 (GeTe layer) is distributed. It should be noted that the third element (group 14 element, i.e., Ge or the like) not constituting the crystal structure of the second layer L2 as described above is called, for the sake of convenience, an additional third element (additional group 14 element, additional Ge or the like) in some cases.

The fundamental structure of the first layer L1 is identical to the structure of the resistive layer 30 described in the above-mentioned embodiment, includes a hexagonal crystal structure containing the first element and second element and, therein, the c-axis of the hexagonal crystal structure is oriented in the Z-direction (film thickness direction). That is, the first layer L1 has an internal structure shown in FIG. 2, and the group 14 element (Ge in this modified example) is distributed in the unit structure UT and gap (van del Waals gap) GP as the third element E3. For example, the first layer L1 has a structure in which Ge is distributed in the $Sb_2Te_3$ layer.

The first layer L1 has a hexagonal crystal structure, and hence the second layer L2 also has a hexagonal crystal structure and in which the c-axis is oriented in the Z-direction (film thickness direction). There are some cases where a gap (van del Waals gap) is provided between the first layer L1 and second layer L2 adjacent to each other. Further, there are also cases where a gap (van del Waals gap) is provided in the second layer L2.

In this modified example too, the fundamental principle of operation is identical to the principle of operation of the above-mentioned embodiment; the resistance value of the resistive layer 30 changes according to the distribution of the third element in the resistive layer 30 and, according to the distribution of the third element, the resistance value of the resistive layer 30 changes. More specifically, the resistance value of the resistive layer 30 changes according to the distribution of the third element in the first layer L1 and gap (van del Waals gap).

The fundamental manufacturing method of this modified example is identical to the manufacturing method described in connection with FIG. 3A and FIG. 3B. That is, in the process of FIG. 3A, an iPCM type preparatory resistive layer 30a is formed. By doping the preparatory resistive layer (iPCM type resistive layer) 30a with the third element (group 14 element) in the same manner as the process of FIG. 3B, the resistive layer 30 having the structure shown in FIG. 1 and FIG. 5 is obtained.

It should be noted that as the third element (group 14 element) with which the iPCM type preparatory resistive layer 30a is doped, a group 14 element identical to the third element (group 14 element) constituting the crystal structure of the second layer L2 may be used or group 14 element different from the above third element (group 14 element) may also be used.

As described above, in this modified example too, as in the case of the above-mentioned embodiment, by changing the distribution of the third element in the resistive layer 30 in the state where the crystal structure of the resistive layer 30 is maintained, the resistance value of the resistive layer 30 is changed. Accordingly, in this modified example too, it is possible to obtain a resistance change type memory element of low power consumption and capable of carrying out a high-speed operation.

Embodiment 2

Figure 6:
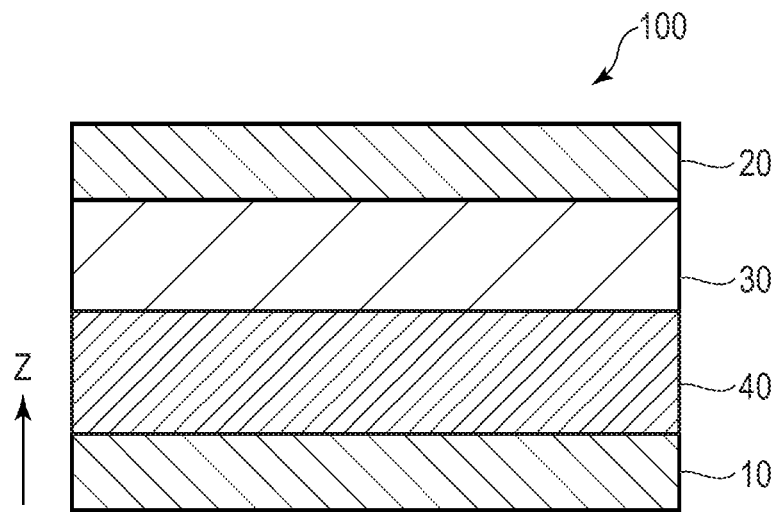
FIG. 6 is a cross-sectional view schematically showing the configuration of a memory device according to a second embodiment.

FIG. 6 is a cross-sectional view schematically showing the configuration of a memory device (resistance change type nonvolatile memory element) according to a second embodiment. It should be noted that the fundamental items of this embodiment are identical to the first embodiment, and descriptions of the items already described in the first embodiment are omitted.

In this embodiment, the resistive layer 30 is formed by introducing the third element (group 14 element such as C, Si, Ge, Sn, Pb, and the like) into the preparatory resistive layer by solid-phase diffusion.

In the memory element 100 of this embodiment, a third element layer 40 (for example, Ge layer) containing the third element (group 14 element, for example, Ge) is provided between the bottom electrode 10 and resistive layer 30. This third element layer 40 functions as a solid-phase diffusion source. That is, by diffusing the third element from the third element layer 40 into the preparatory resistive layer in which the third element is not contained, the resistive layer 30 in which the third element is contained is formed. For example, the resistive layer 30 in which Ge is contained in an $Sb_2Te_3$ layer having the hexagonal crystal structure is formed.

As described above, in this embodiment too, the fundamental crystal structure of the resistive layer 30 is identical to the first embodiment, and the advantage identical to the first embodiment can be obtained.

Figure 7:
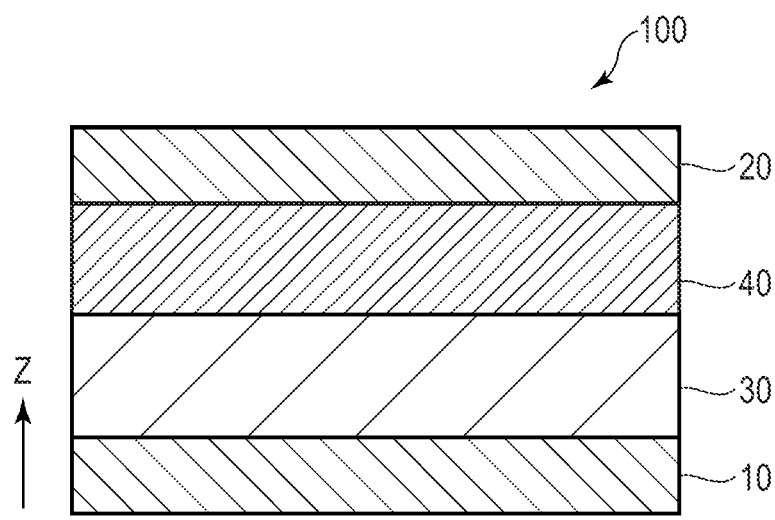
FIG. 7 is a cross-sectional view schematically showing the configuration of a first modified example of the memory device according to the second embodiment.

FIG. 7 is a cross-sectional view schematically showing the configuration of a first modified example of the memory device according to this embodiment.

In the memory element 100 of this modified example, the third element layer 40 containing the third element (group 14 element) is provided between the top electrode 20 and resistive layer 30, and the third element layer 40 functions as the solid-phase diffusion source.

In this modified example too, the fundamental structure of the resistive layer 30 is identical to the first embodiment, and the advantage identical to the first embodiment can be obtained.

Figure 8:
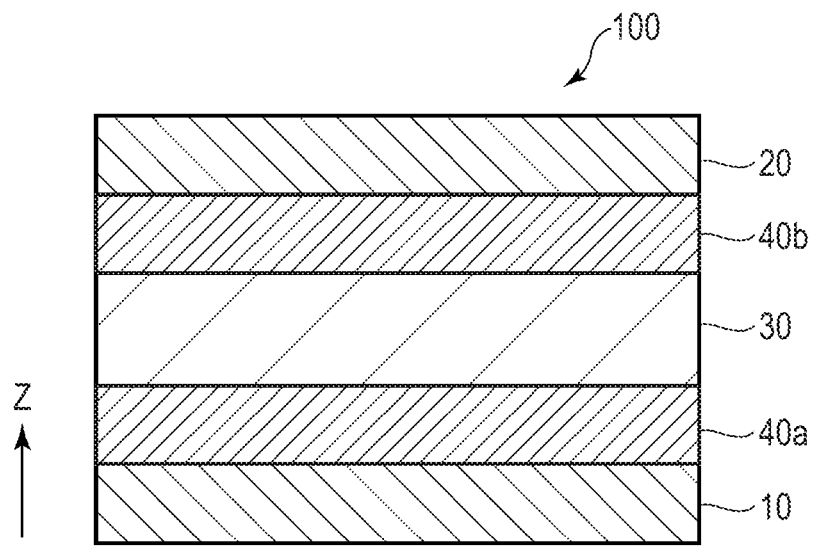
FIG. 8 is a cross-sectional view schematically showing the configuration of a second modified example of the memory device according to the second embodiment.

FIG. 8 is a cross-sectional view schematically showing the configuration of a second modified example of the memory device according to this embodiment.

In this modified example, a third element layer 40a containing the third element (group 14 element) is provided between the bottom electrode 10 and resistive layer 30, and third element layer 40b containing the third element (group 14 element) is provided between the top electrode 20 and resistive layer 30. The third element layers 40a and 40b function as the solid-phase diffusion source.

In this modified example too, the fundamental crystal structure of the resistive layer 30 is identical to the first embodiment, and the advantage identical to the first embodiment can be obtained.

Figure 9:
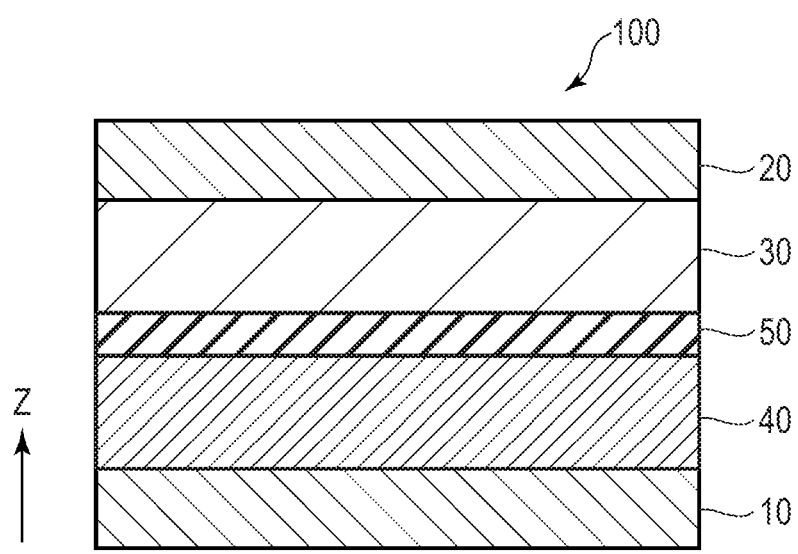
FIG. 9 is a cross-sectional view schematically showing the configuration of a third modified example of the memory device according to the second embodiment.

FIG. 9 is a cross-sectional view schematically showing the configuration of a third modified example of the memory device according to this embodiment.

In this modified example, a third element layer 40 containing the third element (group 14 element) is provided between the bottom electrode 10 and resistive layer 30 and, furthermore, a diffusion-adjusting layer 50 is provided between the resistive layer 30 and third element layer 40.

By providing the diffusion-adjusting layer 50, it is possible to adjust (suppress) the amount of diffusion of the third element from the third element layer 40 into the resistive layer 30. Although the material for the diffusion-adjusting layer 50 is not particularly limited, when an insulating material is used, it is desirable that the thickness of the diffusion-adjusting layer 50 be reduced to such a degree that the resistance value thereof becomes sufficiently smaller than the resistance value of the resistive layer 30.

As the material for the diffusion-adjusting layer 50, an oxide, nitride, oxynitride, and the like can be used. In these materials including the oxide, nitride, oxynitride, and the like, the third element may be contained. For example, as the material for the diffusion-adjusting layer 50, titanium oxide ($TiO_2$), zirconium oxide ($ZrO_2$), hafnium oxide ($HfO_2$), aluminum nitride (AlN), tantalum oxide ($Ta_2O_5$), silicon oxide ($SiO_2$), germanium oxide ($GeO_2$), germanium nitride ($Ge_3N_4$), germanium oxynitride (GeON), silicon nitride ($Si_3N_4$), silicon oxynitride (SiON), and the like can be used.

When an electrically conductive material is used as the material for the diffusion-adjusting layer 50, a metal or metallic compound can be used. In the metallic compound material, the third element may be contained. For example, titanium (Ti), tantalum (Ta), titanium nitride (TiN), tantalum nitride (TaN), tungsten (W), tungsten nitride (WN), nickel-germanium (NiGe), nickel silicide (NiSi), cobalt silicide ($CoSi_2$), platinum silicide (PtSi), titanium carbide (TiC), tantalum carbide (TaC), tungsten carbide (WC), and the like can be used.

In this modified example too, the fundamental structure of the resistive layer 30 is identical to the first embodiment, and the advantage identical to the first embodiment can be obtained.

It should be noted that the third element layer 40 may be provided between the top electrode 20 and resistive layer 30, and diffusion-adjusting layer 50 may be provided between the resistive layer 30 and third element layer 40. Further, the third element layer 40 may be provided between the bottom electrode 10 and resistive layer 30, diffusion-adjusting layer 50 may be provided between the resistive layer 30 and third element layer 40, third element layer 40 may be provided between the top electrode 20 and resistive layer 30, and diffusion-adjusting layer 50 may be provided between the resistive layer 30 and third element layer 40.

Figure 10:
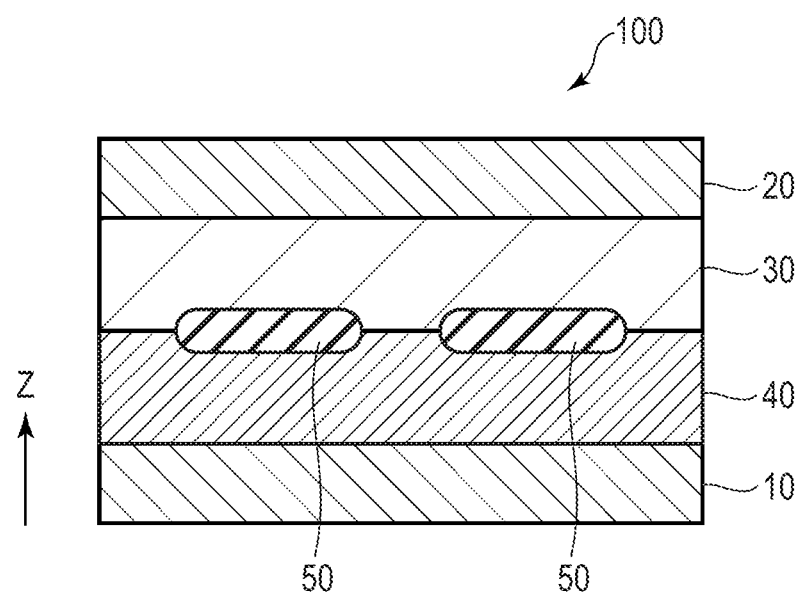
FIG. 10 is a cross-sectional view schematically showing the configuration of a fourth modified example of the memory device according to the second embodiment.

FIG. 10 is a cross-sectional view schematically showing the configuration of a fourth modified example of the memory device according to this embodiment.

In this modified example too, as in the case of the third modified example shown in FIG. 9, the third element layer 40 containing the third element (group 14 element) is provided between the bottom electrode 10 and resistive layer 30 and, furthermore, diffusion-adjusting layer 50 is provided between the resistive layer 30 and third element layer 40. However, in this modified example, the diffusion-adjusting layer 50 is not continuously formed unlike the third modified example and is intermittently formed. Even with such a configuration, the third element diffusion adjustment effect (diffusion suppress effect) can be obtained.

It should be noted that the third element layer 40 may be provided between the top electrode 20 and resistive layer 30, and diffusion-adjusting layer 50 may intermittently be provided between the resistive layer 30 and third element layer 40. Further, the third element layer 40 may be provided between the bottom electrode 10 and resistive layer 30, diffusion-adjusting layer 50 may intermittently be provided between the resistive layer 30 and third element layer 40, third element layer 40 may be provided between the top electrode 20 and resistive layer 30, and diffusion-adjusting layer 50 may intermittently be provided between the resistive layer 30 and third element layer 40.

It should be noted that in this embodiment too, as in the case of the modified example of the first embodiment, an iPCM type resistive layer may be used as the resistive layer 30.

Embodiment 3

Figure 11:
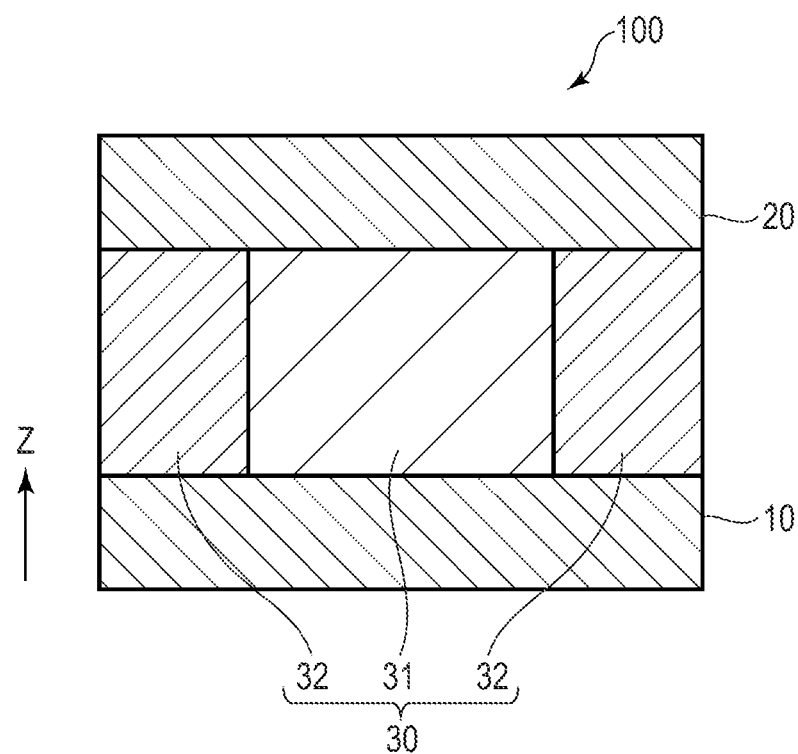
FIG. 11 is a cross-sectional view schematically showing the configuration of a memory device according to a third embodiment.
Figure 12:
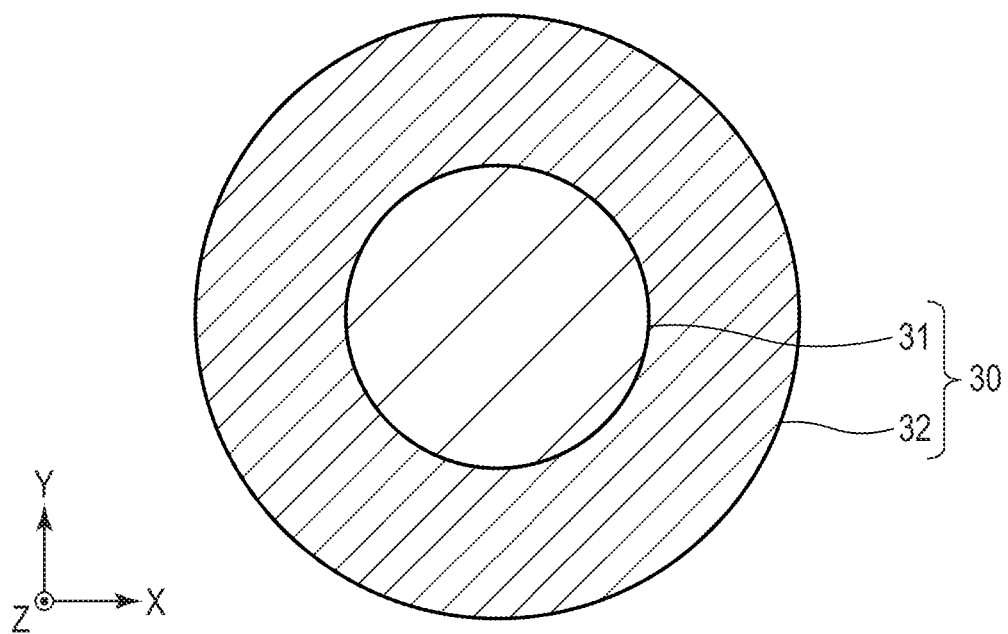
FIG. 12 is a cross-sectional view schematically showing the configuration of the memory device according to the third embodiment.

Each of FIG. 11 and FIG. 12 is a cross-sectional view schematically showing the configuration of a memory device (resistance change type nonvolatile memory element) according to a third embodiment. FIG. 11 is a cross-sectional view parallel with the Z-direction, and FIG. 12 is a cross-sectional view parallel with the X-Y plane perpendicular to the Z-direction. It should be noted that descriptions of the items already described in the first and second embodiments are omitted.

In this embodiment, the resistive layer 30 includes a first resistive layer part 31 and second resistive layer part 32. The first resistive layer part 31 and second resistive layer part 32 are adjacent to each other in a direction perpendicular to the Z-direction. In the example shown in FIG. 11 and FIG. 12, the second resistive layer part 32 surrounds the first resistive layer part 31.

The resistive layer 30 contains therein at least one of antimony (Sb) and bismuth (Bi) as the first element, and tellurium (Te) as the second element. That is, each of the first resistive layer part 31 and second resistive layer part 32 of the resistive layer 30 contains therein both the first element and second element. Further, the second resistive layer part 32 contains therein nitrogen (N) as the additional element. The first resistive layer part 31 contains therein no additional element or contains therein the additional element in a concentration lower than the second resistive layer part 32.

The second resistive layer part 32 has the resistivity higher than the first resistive layer part 31, and resistance between the bottom electrode 10 and top electrode 20 is higher in the second resistive layer part 32 than in the first resistive layer part 31. Further, the resistance value of the first resistive layer part 31 is variable, and resistance value of the second resistive layer part 32 does not change. Accordingly, in this embodiment, the first resistive layer part 31 functions as the substantial resistance change layer.

Hereinafter, some configuration examples of this embodiment will be described. Any one of the configuration examples has the fundamental configuration described above.

First Configuration Example

In the first configuration example, the resistive layer 30 further contains therein a group 14 element (group 14 element such as C, Si, Ge, Sn, Pb, and the like) as the third element in addition to the first element and second element described above. For example, the resistive layer 30 contains therein Ge as the third element.

The first resistive layer part 31 of the resistive layer 30 has a structure identical to the resistive layer 30 shown in the first embodiment. That is, the first resistive layer part 31 has a hexagonal crystal structure containing the first element and second element, and the c-axis of the hexagonal crystal structure is oriented in the Z-direction (film thickness direction). The internal structure of the first resistive layer part 31 is identical to the internal structure of the resistive layer 30 described in connection with FIG. 2 of the first embodiment. That is, the first resistive layer part 31 has an internal structure in which the group 14 element is distributed in the unit structure UT and gap GP as the third element E3 as shown in FIG. 2. Further, the concentration of the third element contained in the first resistive layer part 31 is also identical to the resistive layer 30 described in the first embodiment.

The second resistive layer part 32 of the resistive layer 30 contains therein nitrogen (N) as the non-contained element (element different from the first, second, and third elements) not contained in the first resistive layer part 31 in addition to the first, second, and third elements described above, and has a resistance value relatively higher in comparison with the first resistive layer part 31.

As described above, in this configuration example, the first resistive layer part 31 of the resistive layer 30 has a structure identical to the resistive layer 30 described in the first embodiment. Accordingly, in this configuration example, in the first resistive layer part 31, an operation identical to the operation of the resistive layer 30 described in the first embodiment is carried out. That is, the distribution of the third element in the first resistive layer part 31 changes according to a write signal (voltage signal or current signal) to be applied between the bottom electrode 10 and top electrode 20, and resistance value of the first resistive layer part 31 changes according to the distribution of the third element. Further, the resistance value of the second resistive layer part 32 is high and resistance value of the second resistive layer part 32 does not change. Accordingly, in this configuration example, the first resistive layer part 31 substantially functions as the resistance change layer, and it is possible to memorize binary data or multilevel data in a nonvolatile manner according to the resistive state (resistance value) of the first resistive layer part 31.

Next, the manufacturing method (manufacturing method of the memory element 100) of the memory device according to this configuration example will be described with reference to the cross-sectional views of FIG. 13A and FIG. 13B.

Figure 13A:
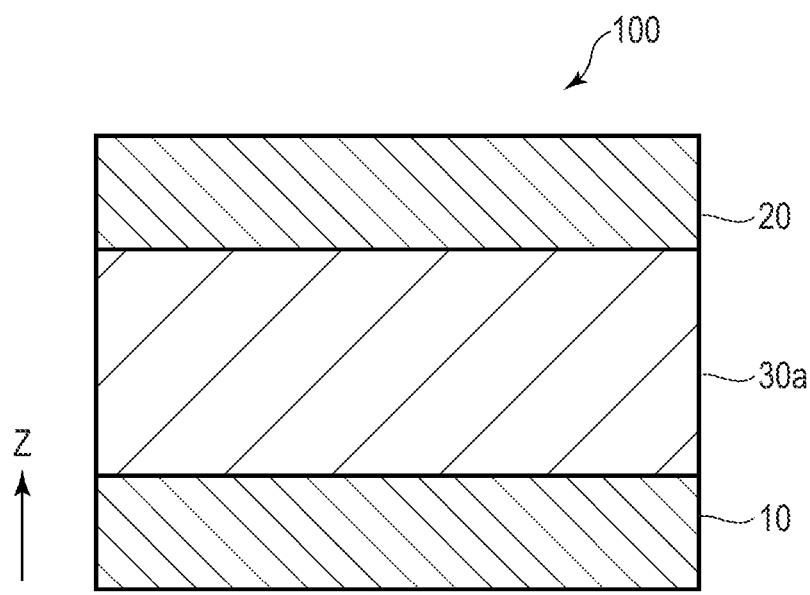
FIG. 13A is a cross-sectional view schematically showing part of the manufacturing method of the memory device according to the third embodiment.

First, as shown in FIG. 13A, the bottom electrode 10, top electrode 20, and preparatory resistive layer 30a for obtaining the resistive layer 30 is formed. The internal structure of the preparatory resistive layer 30a is identical to the structure described in connection with FIG. 2 of the first embodiment, and a layer having a structure in which Ge is distributed in a c-axis-oriented $Sb_2Te_3$ layer having a hexagonal crystal structure is formed.

Figure 13B:
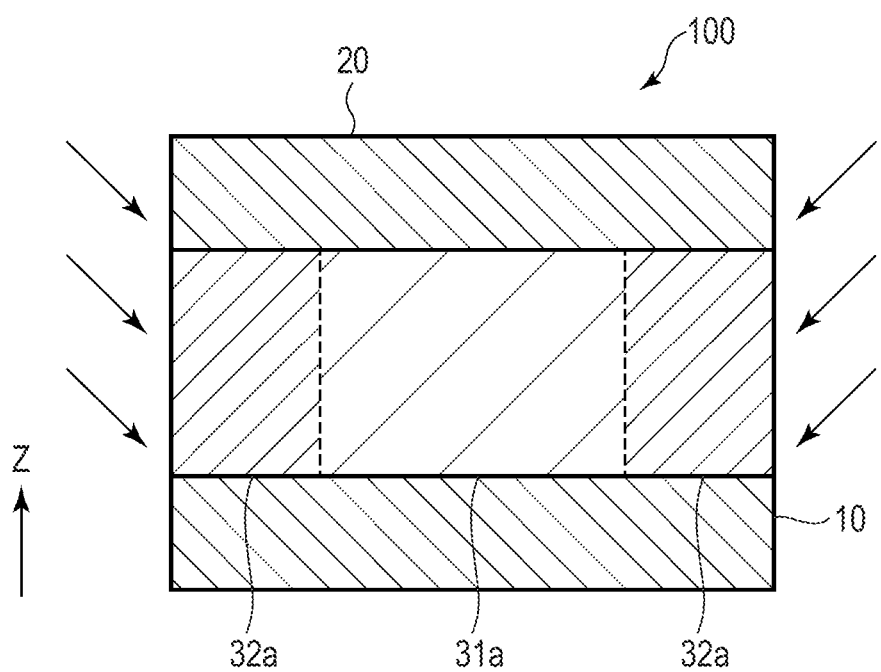
FIG. 13B is a cross-sectional view schematically showing part of the manufacturing method of the memory device according to the third embodiment.

Next, as shown in FIG. 13B, the preparatory resistive layer 30a is doped with N ions by ion implantation. In this configuration example, ion implantation is carried out in such a manner that only the outer part (part corresponding to the second resistive layer part 32) 32a of the preparatory resistive layer 30a is doped with N ions, and inner part (part corresponding to the first resistive layer part 31) 31a is not doped with N ions. For example, implantation of N ions is carried out from obliquely above the preparatory resistive layer 30a at an appropriate accelerating voltage while the semiconductor substrate is rotated. By carrying out ion implantation in this manner, the crystallinity of the outer part 32a of the preparatory resistive layer 30a is collapsed and $Sb_2Te_3$ layer is nitrided. As a result, the resistance of the outer part 32a is made higher (or the outer part 32a is made an insulant).

By the method described above, the resistive layer 30 having the structure shown in FIG. 11 and FIG. 12 is obtained.

As described above, in this configuration example, the fundamental structure of the first resistive layer part 31 of the resistive layer 30 is identical to the resistive layer 30 of the first embodiment, and the advantage identical to the first embodiment can be obtained.

Further, in this configuration example, the resistive layer 30 includes the first resistive layer part 31 having a relatively low resistance and substantially functioning as the resistance change layer, and second resistive layer part 32 having a relatively high resistance and not substantially functioning as the resistance change layer. Accordingly, it is possible to reduce the area of a region through which a current flows as the resistance change layer, and effectively reduce the power consumption.

It should be noted that although in the above-mentioned manufacturing method, the third element is introduced into the preparatory resistive layer 30a by ion implantation, the third element may also be introduced into the preparatory resistive layer 30a by plasma doping, vapor-phase doping or the like.

Second Configuration Example

In the second configuration example too, the resistive layer 30 further contains therein a group 14 element (group 14 element such as C, Si, Ge, Sn, Pb, and the like) as the third element in addition to the first element and second element described above. For example, the resistive layer 30 contains therein Ge as the third element.

In this configuration example, as the first resistive layer part 31 of the resistive layer 30, the iPCM type resistance change layer described in the modified example of the first embodiment is used. That is, the first resistive layer part 31 of this configuration example has a superlattice type crystal structure in which the first layer L1 containing the first element and second element and second layer L2 containing the second element and third element are alternately stacked on top of each other in layers as shown in FIG. 5. For example, the first layer L1 is constituted of four $Sb_2Te_3$ layers, and second layer L2 is constituted of two GeTe layers. The third element (group 14 element, for example, Ge) is distributed in such an iPCM type resistance change layer. That is, in the first resistive layer part 31, Ge (additional group 14 element, additional Ge) not constituting the crystal structure of the second layer (GeTe layer) is distributed.

The second resistive layer part 32 of the resistive layer 30 contains therein nitrogen (N) as the non-contained element (element different from the first, second, and third elements) not contained in the first resistive layer part 31 in addition to the first, second, and third elements described above, and has a resistance value relatively higher in comparison with the first resistive layer part 31.

As described above, in this configuration example too, as in the case of the first configuration example, the first resistive layer part 31 substantially functions as the resistance change layer, and it is possible to memorize data in a nonvolatile manner according to the resistive state (resistance value) of the first resistive layer part 31.

It should be noted that the fundamental manufacturing method of this configuration example is identical to the first configuration example described in connection with FIG. 13A and FIG. 13B. That is, in the process of FIG. 13A, a preparatory resistive layer 30a having the structure identical to the above-mentioned iPCM type first resistive layer part 31 is formed. By doping this preparatory resistive layer 30a with nitrogen (N) ions by the method identical to the process of FIG. 13B, the resistance of the outer part 32a of the preparatory resistive layer 30a is made higher (or the outer part 32a is made an insulant). As a result, the resistive layer 30 having the structure shown in FIG. 11 and FIG. 12 is obtained.

As described above, in this configuration example too, the fundamental structure and fundamental operation are identical to the above-mentioned first configuration example. That is, this configuration example has the structure identical to the first configuration example except for the structure of the first resistive layer part 31. Accordingly, in this configuration example too, the advantage identical to the first configuration example can be obtained.

It should be noted that as the first resistive layer part 31 of the resistive layer 30, an ordinary iPCM type resistive layer may also be used. That is, as the first resistive layer part 31, an iPCM type resistive layer in which no additional third element (no additional group 14 element, no additional Ge) is distributed may also be used.

Third Configuration Example

In the third configuration example, the first resistive layer part 31 of the resistive layer 30 contains therein the first element and second element described above, and contains therein no third element. The first resistive layer part 31 has the structure identical to the preparatory resistive layer 30a shown in FIG. 4 of the first embodiment. That is, the first resistive layer part 31 has a hexagonal crystal structure containing the first element and second element, and the c-axis of the hexagonal crystal structure is oriented in the Z-direction. More specifically, the first resistive layer part 31 is constituted of an $Sb_2Te_3$ layer having the hexagonal crystal structure.

The second resistive layer part 32 of the resistive layer 30 contains therein nitrogen (N) as the non-contained element (element different from the first and second elements) not contained in the first resistive layer part 31 in addition to the first and second elements described above, and has a resistance value relatively higher in comparison with the first resistive layer part 31.

In this configuration example, the first resistive layer part 31 makes a phase change from/to the crystalline phase to/from the amorphous phase, whereby the resistance value of the first resistive layer part 31 changes. More specifically, when the first resistive layer part 31 is in the crystalline phase, the first resistive layer part 31 is in the low-resistance state and, when the first resistive layer part 31 is in the amorphous phase, the first resistive layer part 31 is in the high-resistance state. When a voltage is applied between the bottom electrode 10 and top electrode 20, a relatively large current flows through the first resistive layer part 31 having a relatively low resistance in comparison with the second resistive layer part 32, and the first resistive layer part 31 enters the crystalline state or amorphous state according to the write signal.

As described above, in this configuration example too, the resistance value of the first resistive layer part 31 changes according to the write signal (voltage signal or current signal) to be applied between the bottom electrode 10 and top electrode 20, and the first resistive layer part 31 substantially functions as the resistance change layer. Accordingly, as in the cases of the first and second configuration examples, it is possible to memorize data in a nonvolatile manner according to the resistive state (resistance value) of the first resistive layer part 31.

It should be noted that the fundamental manufacturing method of this configuration example is identical to the first configuration example described in connection with FIG. 13A and FIG. 13B. That is, in the process of FIG. 13A, a preparatory resistive layer 30a having the structure identical to the preparatory resistive layer 30a shown in FIG. 4 is formed. By doping this preparatory resistive layer 30a with nitrogen (N) ions by the method identical to the process of FIG. 13B, the resistance of the outer part 32a of the preparatory resistive layer 30a is made higher (or the outer part 32a is made an insulant). As a result, the resistive layer 30 having the structure shown in FIG. 11 and FIG. 12 is obtained.

Figure 14:
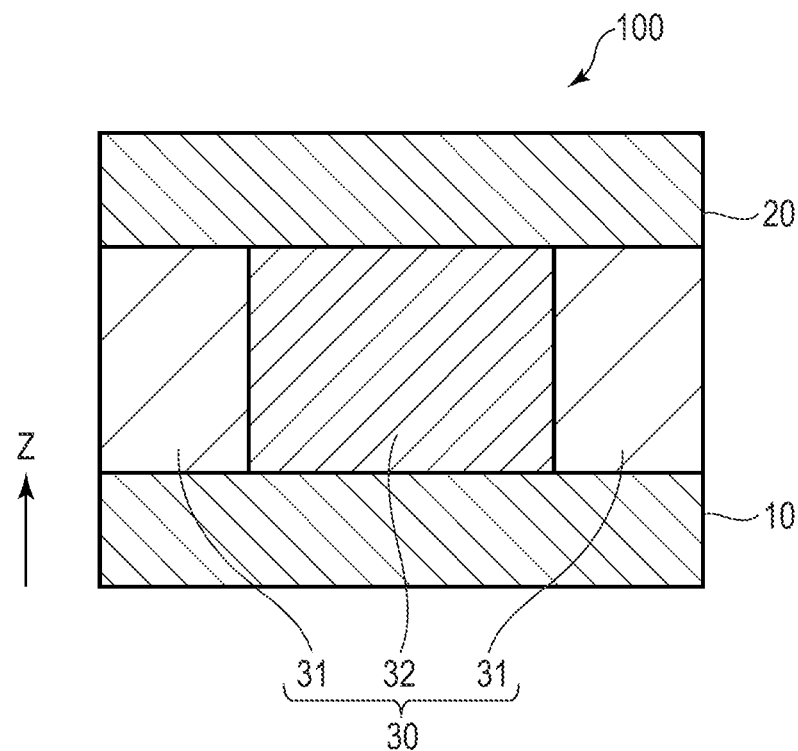
FIG. 14 is a cross-sectional view schematically showing the configuration of a modified example of the memory device according to the third embodiment.
Figure 15:
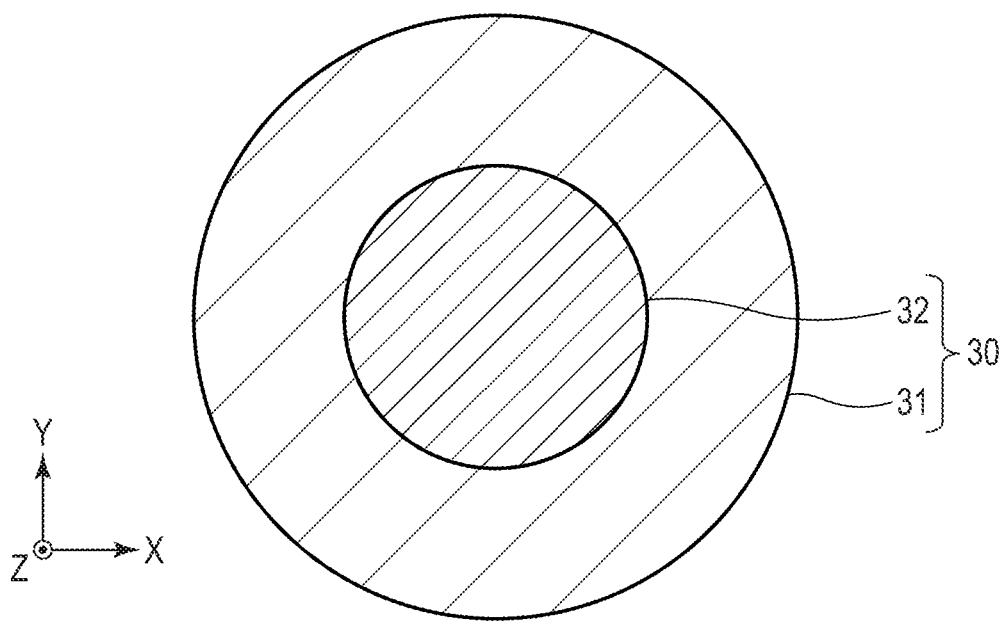
FIG. 15 is a cross-sectional view schematically showing the configuration of the modified example of the memory device according to the third embodiment.

Each of FIG. 14 and FIG. 15 is a cross-sectional view schematically showing the configuration of a modified example of the memory device according to this embodiment. FIG. 14 is a cross-sectional view parallel with the Z-direction, and FIG. 15 is a cross-sectional view parallel with the X-Y plane perpendicular to the Z-direction.

In this modified example too, the first resistive layer part 31 and second resistive layer part 32 are adjacent to each other in a direction perpendicular to the Z-direction. However, in this modified example, the first resistive layer part 31 surrounds the second resistive layer part 32. The fundamental crystal structure of the first resistive layer part 31 and second resistive layer part 32 is identical to the structure shown in the first, second, and third configurations described above. For example, by appropriately adjusting the accelerating voltage of nitrogen ion implantation, it is possible to obtain the structure shown in FIG. 14 and FIG. 15.

In this modified example too, as in the case of the embodiment described above, the resistive layer 30 includes the first resistive layer part 31 having a relatively low resistance and substantially functioning as the resistance change layer, and second resistive layer part 32 having a relatively high resistance and not substantially functioning as the resistance change layer. Accordingly, it is possible to reduce the area of a region through which a current flows as the resistance change layer, and effectively reduce the power consumption.

Embodiment 4

Figure 16:
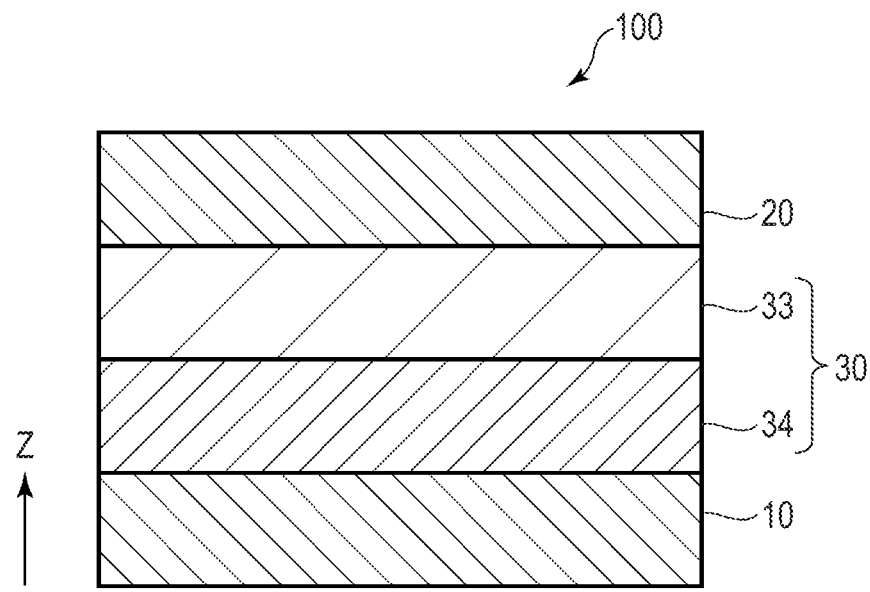
FIG. 16 is a cross-sectional view schematically showing the configuration of a memory device according to a fourth embodiment.

FIG. 16 is a cross-sectional view schematically showing the configuration of a memory device (resistance change type nonvolatile memory element) according to a fourth embodiment. It should be noted that descriptions of the items already described in the first to third embodiments are omitted.

The resistive layer 30 contains therein at least one of antimony (Sb) and bismuth (Bi) as a first element, and tellurium (Te) as a second element, and further contains therein a group 14 element or group 16 element as a third element varying in concentration in the Z-direction.

In the example shown in FIG. 16, in the resistive layer 30, a high- concentration layer 33 in which the concentration of the third element is relatively higher is positioned on the top electrode 20 side, and low-concentration layer 34 in which the concentration of the third element is relatively lower is positioned on the bottom electrode 10 side. In the low-concentration layer 34, the third element may not be substantially contained.

It is possible for the resistive layer 30 to exhibit a first resistive state including a first layer having a hexagonal crystal structure containing the first element and second element.

More specifically, in the above-mentioned first resistive state, a first case (case where a group 14 element is contained) where the crystal structure shown in FIG. 2 of the first embodiment is provided, second case (case where no group 14 element is contained) where the crystal structure shown in FIG. 4 of the first embodiment is provided, third case where the iPCM type crystal structure shown in FIG. 5 of the first embodiment is provided, and the additional group 14 element is contained, and fourth case where the iPCM type crystal structure shown in FIG. 5 of the first embodiment is provided, and no additional group 14 element is contained are included.

The resistive layer 30 can make a phase change from/to the above-mentioned first resistive state (crystalline state) to/from the second resistive state (amorphous state). Therefore, the resistance value of the resistive layer 30 changes according to the state (first resistive state, second resistive state) of the resistive layer 30.

First, the case where the group 14 element is contained in the resistive layer 30 as the third element varying in concentration in the Z-direction will be described below.

In the case where the group 14 element is contained in the resistive layer 30 as the third element varying in concentration in the Z-direction, when the concentration of the third element is lower, the melting point becomes higher than when the concentration of the third element is higher. Accordingly, when the resistive layer 30 makes a phase change from the crystalline phase to the amorphous phase, even if the whole high-concentration layer 33 has changed to the amorphous state, part of the low-concentration layer 34 can maintain the crystalline state thereof without changing to the amorphous state. Accordingly, when the resistive layer 30 makes a phase change from the amorphous state to the crystalline state (above-mentioned first resistive state), crystallization is started from the part at which the crystalline state of the low- concentration layer 34 is maintained, whereby the change from the amorphous state to the crystalline state (above-mentioned first resistive state) is facilitated.

Next, the case where the group 16 element is contained in the resistive layer 30 as the third element varying in concentration in the Z-direction will be described below.

In the case where the group 16 element is contained in the resistive layer 30 as the third element varying in concentration in the Z-direction, when the concentration of the third element is higher, the melting point becomes higher than when the concentration of the third element is lower. Accordingly, when the resistive layer 30 makes a phase change from the crystalline phase to the amorphous phase, even if the whole low- concentration layer 34 has changed to the amorphous state, part of the high-concentration layer 33 can maintain the crystalline state thereof without changing to the amorphous state. Accordingly, when the resistive layer 30 makes a phase change from the amorphous state to the crystalline state (above-mentioned first resistive state), crystallization is started from the part at which the crystalline state of the high- concentration layer 33 is maintained, whereby the change from the amorphous state to the crystalline state (above-mentioned first resistive state) is facilitated.

As described above, in this embodiment, by varying the concentration of the third element in the resistive layer 30 in the Z-direction, it is possible to easily change the state from the amorphous state to the crystalline state, and effectively reduce the power consumption.

Figure 17:
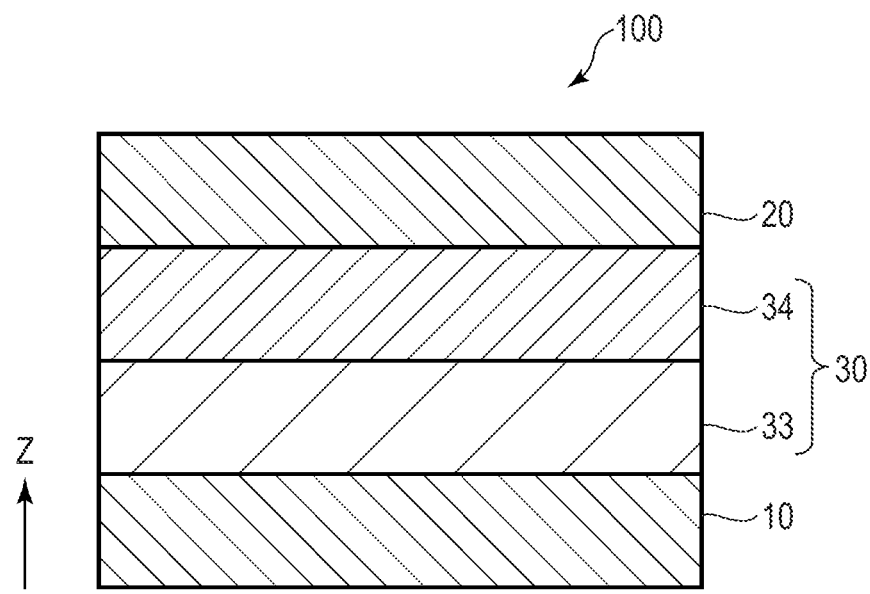
FIG. 17 is a cross-sectional view schematically showing the configuration of a first modified example of the memory device according to the fourth embodiment.

FIG. 17 is a cross-sectional view schematically showing the configuration of a first modified example of this embodiment.

In this modified example too, as in the case of the embodiment described above, the concentration of the third element (group 14 element or group 16 element) is varied in the Z-direction. However, in this modified example, the high- concentration layer 33 is positioned on the bottom electrode 10 side, and low-concentration layer 34 is positioned on the top electrode 20 side. The other fundamental configurations and fundamental operations are identical to the embodiment described above, and the advantage identical to the embodiment described above can be obtained.

Figure 18:
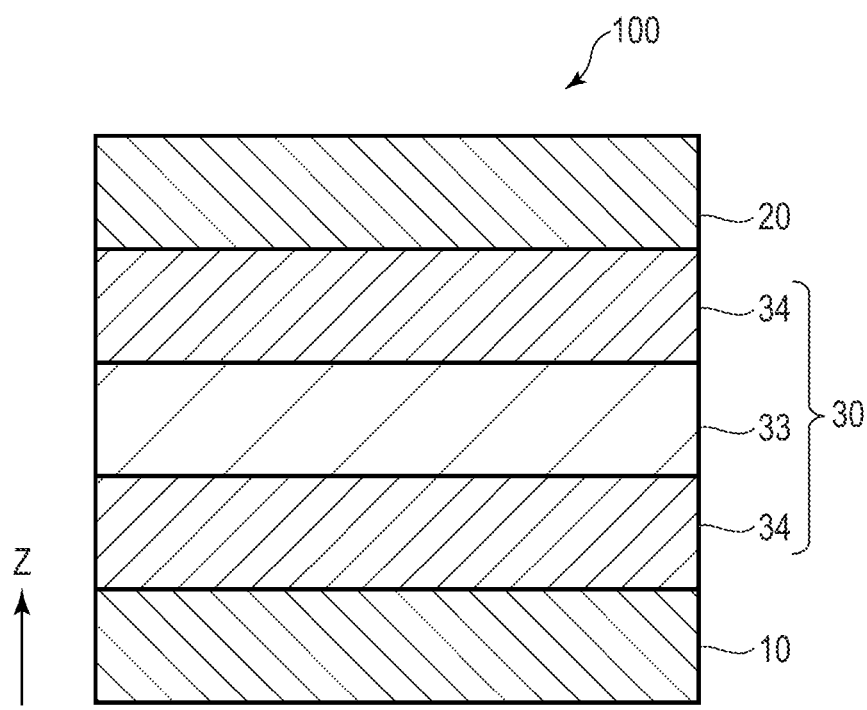
FIG. 18 is a cross-sectional view schematically showing the configuration of a second modified example of the memory device according to the fourth embodiment.

FIG. 18 is a cross-sectional view schematically showing the configuration of a second modified example of this embodiment. In this modified example too, as in the case of the embodiment described above, the concentration of the third element (group 14 element or group 16 element) is varied in the Z-direction. However, in this modified example, the high-concentration layer 33 is positioned between the two low-concentration layers 34. The other fundamental configurations and fundamental operations are identical to the embodiment described above, and the advantage identical to the embodiment described above can be obtained. The low-concentration layer 34 may be positioned between the two high-concentration layers 33 by carrying out ion implantation twice or more for each of different accelerating voltages.

It should be noted that although in the above-described embodiments, first modified example, and second modified example, the descriptions have been given of a case where the resistive layer 30 makes a phase change from/to the crystalline state to/from the amorphous state, whereby the resistance value of the resistive layer 30 changes, there is also a case where the resistance value of the resistive layer 30 changes while the resistive layer 30 maintains the crystalline state (above-mentioned first resistive state) thereof as it is.

More specifically, when a group 14 element is contained in the resistive layer 30 as the third element varying in concentration in the Z-direction, at the high-concentration part, the amount of movement of the third element (amount of movement between the unit structure UT and gap GP shown in FIG. 2) is large, and hence a large resistance change can be obtained. As a result, it is possible to effectively make the part at which the concentration of the third element is high function as the resistance change layer.

Further, it is desirable that as the above-mentioned group 16 element, a chalcogen element such as sulfur (S), selenium (Se), tellurium (Te) or the like be used. Further, oxygen (O) easily combines not only with Sb and Bi, but also with Te. Accordingly, when oxygen is used, the shape of the resistive layer 30 is deformed by the repetitive memory operations thereby deteriorating the endurance characteristics.

Application Example

Hereinafter, an application example of the memory device (resistance change type nonvolatile memory element) described in each of the above first to fourth embodiments will be described.

Figure 19:
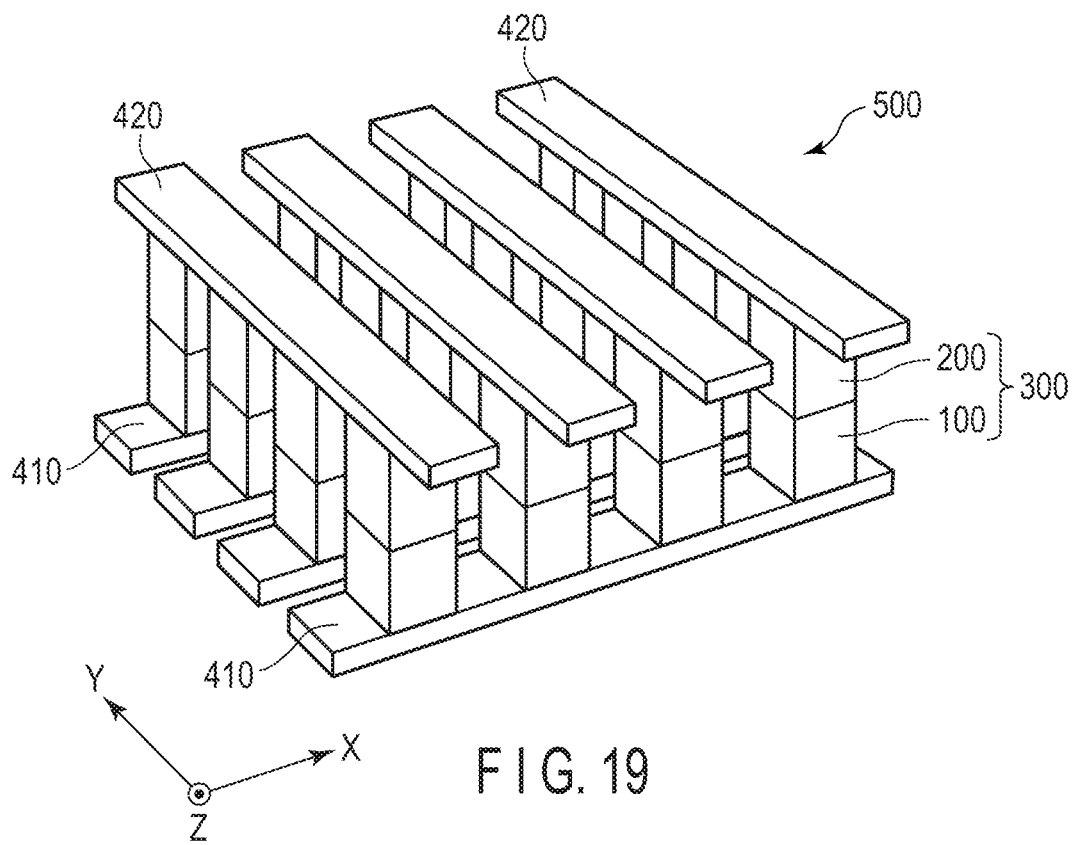
FIG. 19 is a bird's-eye view schematically showing the configuration of a memory-cell array section including memory elements described in the first to fourth embodiments.

FIG. 19 is a bird's-eye view schematically showing the configuration of a memory-cell array section including the memory elements 100 described in the first to fourth embodiments.

The memory-cell array section 500 shown in FIG. 19 has a configuration in which a plurality of memory cells 300 is provided between a plurality of first wiring members 410 and plurality of second wiring members 420.

Each of the first wiring members 410 extends in the X-direction, and each of the second wiring members 420 extends in the Y-direction. The first wiring member 410 and second wiring member 420 intersect each other. More specifically, the first wiring member 410 and second wiring member 420 intersect each other at right angles. One of the first wiring member 410 and second wiring member 420 corresponds to a word line, and the other of the first wiring member 410 and second wiring member 420 corresponds to a bit line.

Each of the memory cells 300 is connected between a corresponding first wiring member 410 and corresponding second wiring member 420, and includes a memory element 100, and selecting element 200 connected in series to the memory element 100. More specifically, each memory cell 300 has a structure in which the memory element 100 and selecting element 200 are stacked in the Z-direction. It should be noted that although in the example shown in FIG. 19, the configuration in which the selecting element 200 is stacked on top of the memory element 100 is shown, conversely, the configuration in which the memory element 100 is stacked on top of the selecting element 200 may also be employed.

The memory element 100 is an element corresponding to the memory element 100 described in the above-mentioned first to fourth embodiments, and is a resistance change type nonvolatile memory element.

The selecting element 200 is an element configured to select the memory element 100 connected in series to the selecting element 200. In the example shown in FIG. 19, as the selecting element 200, a two-terminal selecting element having nonlinear current-voltage characteristics is used. More specifically, as the selecting element 200, a diode or two-terminal switch element containing therein a chalcogen element can be used.

Figure 20:
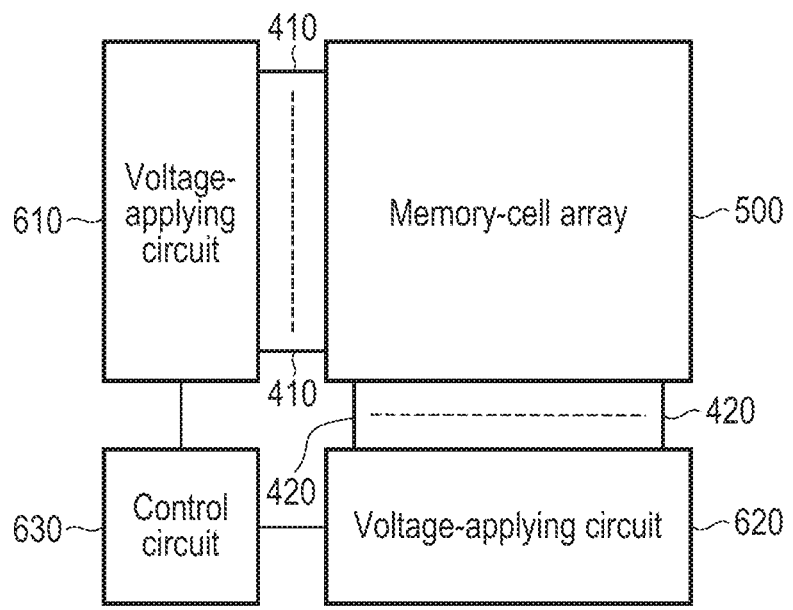
FIG. 20 is a block diagram showing the overall configuration of a nonvolatile memory including the memory-cell array section shown in FIG. 19.

FIG. 20 is a block diagram showing the overall configuration of a nonvolatile memory including the above-mentioned memory-cell array section 500.

The nonvolatile memory shown in FIG. 20 includes a memory-cell array section 500, voltage-applying circuit 610, voltage-applying circuit 620, and control circuit 630. The memory-cell array section 500 is a section corresponding to the memory-cell array section 500 of FIG. 19, and a plurality of memory cells 300 shown in FIG. 19 is arranged therein. The voltage-applying circuit 610 is a circuit configured to apply a voltage to the first wiring member 410 shown in FIG. 19. The voltage-applying circuit 620 is a circuit configured to apply a voltage to the second wiring member 420 shown in FIG. 19. The control circuit 630 is a circuit configured to control the voltage-applying circuit 610 and voltage-applying circuit 620.

By applying the memory element 100 described in the first to fourth embodiments to the memory-cell array section shown in FIG. 19 and nonvolatile memory shown in FIG. 20, it is possible to obtain a nonvolatile memory of low power consumption and capable of carrying out a high-speed operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first electrode;
a second electrode; and
a resistive layer provided between the first electrode and the second electrode, containing at least one of antimony (Sb) and bismuth (Bi) as a first element, and tellurium (Te) as a second element, and having a variable resistance value, wherein
the resistive layer includes a first layer having a hexagonal crystal structure containing the first element and the second element and the first layer contains a group 14 element as a third element,
wherein the first layer includes a plurality of unit structures each containing the first element and the second element, and has a gap provided between the unit structures adjacent to each other in a first direction in which the first electrode, the second electrode, and the resistive layer are stacked, and
when the first element is expressed as E1, and the second element is expressed as E2, each of the unit structures is constituted of five atomic layers arranged in the first direction in the order of E2-E1-E2-E1-E2.

2. The device of claim 1, wherein
a c-axis of the hexagonal crystal structure of the first layer is oriented in the first direction.

3. The device of claim 1, wherein
the first layer contains the third element within a range of $1\times10^{18}$ to $1\times10^{21}$ cm$^3$.

4. The device of claim 1, wherein
the resistance value of the resistive layer changes according to a distribution of the third element in the first layer.

5. The device of claim 1, wherein
the resistive layer has a superlattice type crystal structure in which the first layer and a second layer containing the second element and the third element are alternately stacked.

6. The device of claim 1, further comprising a third layer provided between the first electrode and the resistive layer and containing the third element.

7. The device of claim 1, wherein
the group 14 element is selected from a group consisting of carbon (C), silicon (Si), germanium (Ge), tin (Sn), and lead (Pb).

* * * * *